United States Patent
Woo et al.

(10) Patent No.: US 8,981,399 B2
(45) Date of Patent: Mar. 17, 2015

(54) METHOD OF FABRICATING LIGHT EMITTING DIODE PACKAGE WITH SURFACE TREATED RESIN ENCAPSULANT AND THE PACKAGE FABRICATED BY THE METHOD

(75) Inventors: Do Choul Woo, Anyang-si (KR); Min Hong Kim, Hwaseong-si (KR); Mi Gyeong Ko, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 884 days.

(21) Appl. No.: 12/297,899

(22) PCT Filed: Apr. 3, 2007

(86) PCT No.: PCT/KR2007/001614
§ 371 (c)(1),
(2), (4) Date: Oct. 21, 2008

(87) PCT Pub. No.: WO2007/123310
PCT Pub. Date: Nov. 1, 2007

(65) Prior Publication Data
US 2009/0146169 A1 Jun. 11, 2009

(51) Int. Cl.
*H01L 33/60* (2010.01)
*H01L 33/56* (2010.01)
*B29C 45/14* (2006.01)
*C08L 63/00* (2006.01)
*B29L 11/00* (2006.01)

(52) U.S. Cl.
CPC .......... *H01L 33/56* (2013.01); *B29C 45/14639* (2013.01); *C08L 63/00* (2013.01); *B29L 2011/00* (2013.01); *H01L 2224/48091* (2013.01); *H01L 2224/8592* (2013.01)
USPC .............................................. 257/98; 438/26

(58) Field of Classification Search
USPC .......... 257/81, 82, 91, 98, 99, 100, 116, 117, 257/432–437, 749, E33.056–E33.059, 257/E25.032, E21.499
See application file for complete search history.

(56) References Cited

U.S. PATENT DOCUMENTS

| | | | |
|---|---|---|---|
| 7,488,432 B2 * | 2/2009 | Murazaki et al. | 252/301.4 R |
| 2004/0116033 A1 | 6/2004 | Ouderkirk et al. | |
| 2005/0156189 A1* | 7/2005 | Deguchi et al. | 257/103 |
| 2006/0205237 A1* | 9/2006 | Kodama et al. | 438/790 |

FOREIGN PATENT DOCUMENTS

| | | | |
|---|---|---|---|
| JP | 2001-196644 | * | 7/2001 |
| JP | 2002-280607 | | 9/2002 |

* cited by examiner

*Primary Examiner* — Tony Tran
(74) *Attorney, Agent, or Firm* — H.C. Park & Associates, PLC

(57) ABSTRACT

Disclosed are a method of fabricating a light emitting diode package with a surface treated resin encapsulant and a package fabricated by the method. According to the method of fabricating a light emitting diode package, a resin encapsulant encapsulating a light emitting diode chip is surface treated using plasma. Thus, a bonding force between the surface treated resin encapsulant and a resin molding member covering it is increased.

11 Claims, 3 Drawing Sheets

METHOD OF FABRICATING LIGHT EMITTING DIODE PACKAGE WITH SURFACE TREATED RESIN ENCAPSULANT AND THE PACKAGE FABRICATED BY THE METHOD

CROSS REFERENCE TO RELATED APPLICATIONS

This application is the National Stage of International Application No. PCT/KR2007/001614, filed Apr. 3, 2007, and claims priority from and the benefit of Korean Patent Application No. 10-2006-0036071, filed on Apr. 21, 2006, which are both hereby incorporated by reference for all purposes as if fully set forth herein.

BACKGROUND OF THE INVENTION

1. Field of the Invention

The present invention relates to a method of fabricating a light emitting diode package and a package fabricated by the method, and more particularly, to a method of fabricating a light emitting diode package with surface treated resin encapsulant and a package fabricated by the method.

2. Discussion of the Background

A light emitting diode has been widely used for indicators, display boards and display devices since the light emitting diode can implement colors. White light can also be implemented, so that the light emitting diode has been used for general illumination. Further, light in regions besides visual light, i.e., ultraviolet or infrared light, can be implemented, so that the light emitting diode has been used in various fields such as an optical communication. Since such a light emitting diode has high efficiency and long life span and is ecological, the fields in which the light emitting diode is used have been continuously extended.

A light emitting diode made of an inorganic based material, such as GaN, GaAs or GaP, is generally fabricated in the form of a chip and assembled together with leads and a package main body. A light emitting diode package is fabricated to have various structures, e.g., a chip type structure, a top view structure, a side view structure, a power type structure and a lamp type structure.

A light emitting diode package fabricated with the aforementioned structures typically contains a light emitting diode mounted within a recess of the package main body, electrically connected to leads that protrude to the outside of the package main body and encapsulated by a resin. Said resin encapsulant is then covered by a resin molding member. The resin molding member has appropriate hardness to protect the resin encapsulant and the light emitting diode chip.

Many top view light emitting diode packages employ the resin encapsulant with a relatively low hardness and the resin molding member with a relatively high hardness, thereby protecting the light emitting diode chip from moisture and an external force. Unfortunately, due to the differences in thermal expansion coefficients of the resin encapsulant and the resin molding member, cracks or deformation of the resin encapsulant occurs.

In addition, in a case where the resin encapsulant and the resin molding member are formed of different materials from each other, an air layer may be formed in an interface there between. As time goes on, the resin molding member may be separated from the resin encapsulant. The air layer formed in the interface between the resin encapsulant and the resin molding member and a space formed due to the separation at the interface change the light radiation characteristic of the light emitting diode package, thereby reducing the life span of the package.

SUMMARY OF THE INVENTION

The present invention provides a method of fabricating a light emitting diode package capable of preventing an air layer from being formed in an interface between a resin encapsulant and a resin molding member, or preventing the resin molding member from being separated from the resin encapsulant.

The present invention also provides a light emitting diode package capable of preventing an air layer from being formed in an interface between a resin encapsulant and a resin molding member, or preventing the separation of the resin molding member at the interface.

Additional features of the invention will be set forth in the description which follows, and in part will be apparent from the description, or may be learned by practice of the invention.

The present invention discloses a method of fabricating a light emitting diode package that includes preparing a chip mounting member having a mounting surface for mounting a chip thereon. The chip mounting member includes at least two leads insulated from each other. At least one light emitting diode chip is mounted on the mounting surface of the chip mounting member and electrically connected to the at least two leads. Thereafter, a resin encapsulant encapsulating the at least one light emitting diode chip is formed, and the resin encapsulant is surface treated using plasma. Subsequently, a resin molding member covering the surface treated resin encapsulant is formed. Accordingly, a bonding force between the resin encapsulant and the resin molding member is increased, so that an air layer can be prevented from being formed between the resin molding member and the resin encapsulant, and the resin molding member can be prevented from being separated from the resin encapsulant.

The present invention also discloses a light emitting diode package having a surface treated resin encapsulant. The light emitting diode package comprises a chip mounting member having a mounting surface for mounting a chip thereon. The chip mounting member comprises two leads insulated from each other. Meanwhile, a light emitting diode chip is mounted on the mounting surface of the chip mounting member. The light emitting diode chip is electrically connected to the leads. A resin encapsulant encapsulates the light emitting diode chip. The resin encapsulant has a surface treated using plasma. A resin molding member covers the resin encapsulant. Accordingly, a bonding force between the surface treated resin encapsulant and the resin molding member is increased, so that an air layer between the resin molding member and the resin encapsulant can be removed, and the resin molding member can be prevented from being separated from the resin encapsulant.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
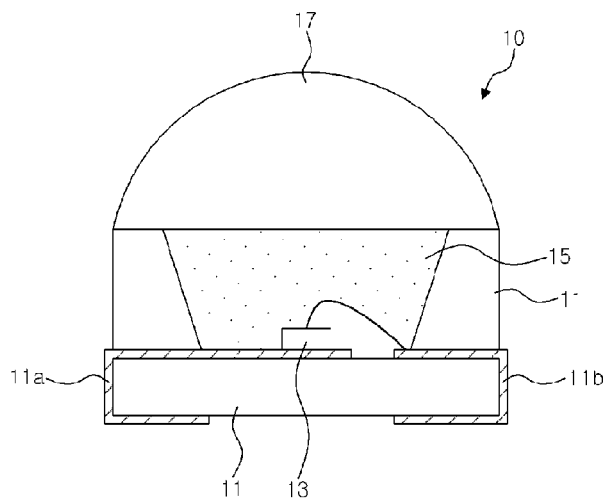
FIG. 1 is a sectional view illustrating a top view light emitting diode package according to a related art.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

FIG. 1 is a sectional view illustrating a conventional top view light emitting diode package 10 according to a related art.

Referring to FIG. 1, the top view light emitting diode package 10 generally comprises a package main body 11 having a recess. Leads 11a and 11b are exposed within the recess of the package main body 11. Each of the leads 11a and 11b extends and protrudes to the outside of the package main body. A light emitting diode chip 13 is mounted within the recess and electrically connected to the leads 11a and 11b. For example, the light emitting diode chip 13 is die-bonded on a pad region (not shown) of the lead 11a and electrically connected to the lead 11b through a bonding wire.

Meanwhile, a resin encapsulant 15 is formed in the recess to encapsulate the light emitting diode chip 13. The resin encapsulant 15 may contain a phosphor for converting the wavelength of light emitted from the light emitting diode chip 13. Various colors of light, e.g., white light, may be implemented by combining the light emitting diode chip 13 and the phosphor.

In the meantime, a resin molding member 17 covers the resin encapsulant 15. The resin molding member 17 may also contain a phosphor, and may have a variety of shapes. The resin molding member 17 has appropriate hardness to protect the resin encapsulant 15 and the light emitting diode chip 13.

The top view light emitting diode package 10 employ the resin encapsulant 15 with a relatively low hardness and the resin molding member 17 with a relatively high hardness, thereby protecting the light emitting diode chip 13 from moisture and an external force. In addition, it is possible to solve an interface problem between the light emitting diode chip 13 and the resin encapsulant 15, e.g., cracks generated due to a difference of thermal expansion coefficients there between or deformation of the resin encapsulant 15 due to the heat generated from the light emitting diode chip 13.

However, in a case where the resin encapsulant 15 and the resin molding member 17 are formed of different materials from each other, an air layer may be formed in an interface there between. As time goes on, the resin molding member 17 may be separated from the resin encapsulant 15. The air layer formed in the interface between the resin encapsulant 15 and the resin molding member 17 and a space formed due to the separation at the interface change the light radiation characteristic of the light emitting diode package 10, e.g., the distribution of light emitted there from, thereby reducing the life span of the package.

Figure 2:
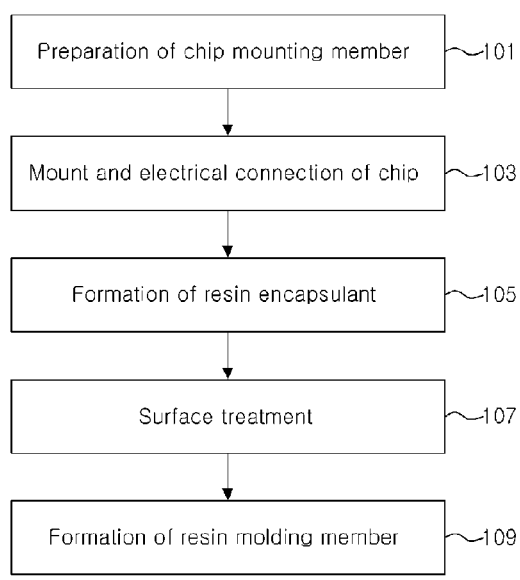
FIG. 2 is a flowchart illustrating a method of fabricating a light emitting diode package according to embodiments of the present invention.
Figure 3:
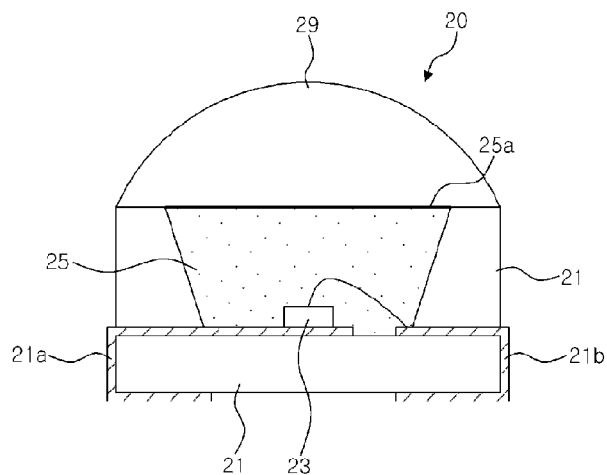
FIG. 3 is a sectional view illustrating a top view light emitting diode package according to an embodiment of the present invention.

FIG. 2 is a flowchart illustrating a method of fabricating a light emitting diode package according to embodiments of the present invention, and FIG. 3 is a sectional view illustrating a top view light emitting diode package 20 according to an embodiment of the present invention.

Referring to FIGS. 2 and 3, a chip mounting member having a mounting surface for mounting a chip thereon is prepared (Step 101). In the top view light emitting diode package, the chip mounting member means a package main body 21 having at least two leads 21a and 21b. The package main body 21 has a recess for exposing the leads 21a and 21b, wherein a sidewall of the recess is inclined to reflect light.

At least one light emitting diode chip 23 is mounted on the mounting surface of the package main body 21 and then is electrically connected to the leads 21a and 21b (Step 103). The light emitting diode chip 23 may be fabricated of, for example, a semiconductor, such as GaN, GaAs or GaP. The light emitting diode chip 23 may be die-bonded on the lead 21a as shown in FIG. 3, but the present invention is not limited thereto. That is, the light emitting diode chip 23 may be mounted on a surface of a substrate between the leads 21a and 21b.

Meanwhile, one surface of the light emitting diode chip 23 may be electrically connected to the lead 21a through die-bonding and the other surface thereof may be electrically connected to the lead 21b through a bonding wire. Such a light emitting diode chip is referred to as a one-bond die. Meanwhile, two electrodes of the light emitting diode chip 23 may be connected to the leads 21a and 21b through bonding wires, respectively. Such a light emitting diode chip is referred to as a two-bond die. In the embodiments of the present invention, one-bond and two-bond dies may be compatible with each other. Further, the light emitting diode chip 23 may be flip-bonded to a submount (not shown), and the submount may be electrically connected to the leads 21a and 21b.

A resin encapsulant 25 encapsulating the light emitting diode chip 23 is formed (Step 105). The resin encapsulant 25 may be formed by being dotted using a dispenser and then cured, or by a transfer molding technique. The resin encapsulant 25 may be cured and formed through heat curing, ultraviolet curing or natural curing. Meanwhile, a phosphor may be incorporated in the resin encapsulant 25. The resin encapsulant 25 may be formed of epoxy or silicone resin. Preferably, the resin encapsulant is formed of silicone resin.

The resin encapsulant 25 is surface treated using plasma (Step 107). Accordingly, a plasma-treated surface 25a is formed on top of the resin encapsulant 25.

A variety of gases are used in a plasma process. For example, an inert gas, $H_2$, $O_2$, $O_3$, $N_2$, CO, $NH_3$, a hydrocarbon gas, e.g., $CH_4$ or $C_2H_6$, or the like may be used as a source gas of the plasma. These gases may be used solely or in combination of two or more kinds of gases. The resin encapsulant 25 may be treated by plasma generated with a power of 10 to 1,000 W for 10 to 1,000 seconds.

Plasma gas beats the surface of the resin encapsulant 25 to form irregularities on the surface thereof and is stuck in the surroundings of the surface of the resin encapsulant 25. Meanwhile, a specific kind of gas, e.g., an ammonia or hydrocarbon gas, may be stuck in the surroundings of the surface of the resin encapsulant 25 and be bonded to the resin molding member to be formed thereon. The irregularities formed on the surface of the resin encapsulant 25 and the gas stuck in the surroundings of the surface thereof cause a bonding force of the resin encapsulant 25 to be increased. Further, the plasma gas allows a top surface of the package main body 21 to be surface treated, thereby increasing a bonding force of the package main body 21.

A resin molding member 29 is formed on the surface treated resin encapsulant 25 (Step 109). The resin molding member 29 may be formed to have a predetermined shape using a die. The resin molding member 29 may be formed of, for example, epoxy or silicone resin. Preferably, the resin molding member is formed of epoxy resin with a relatively high hardness.

The resin molding member 29 covers the resin encapsulant 25, and is bonded to the top surface of the package main body 21. The bonding force between the resin molding member 29 and the resin encapsulant 25 is increased by the irregularities formed on the surface 25a of the resin encapsulant 25 or the plasma gas remaining near the surface 25a of the resin encapsulant 25. Accordingly, an air layer can be prevented from being formed between the resin encapsulant 25 and the resin molding member 29, and the separation of the resin molding member 29 from the resin encapsulant 25, which occurs when the package is used for a long period of time, can be reduced.

Figure 4:
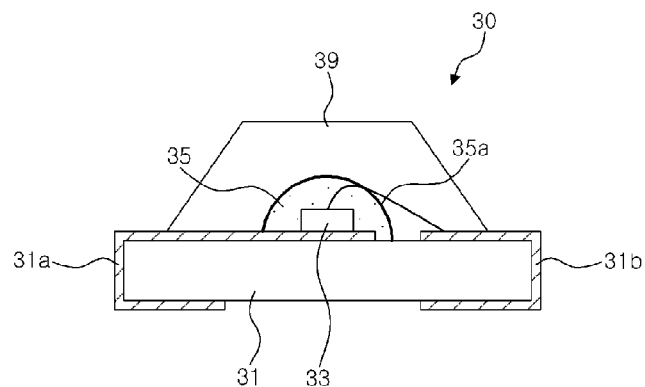
FIG. 4 is a sectional view illustrating a chip type light emitting diode package according to an embodiment of the present invention.

FIG. 4 is a sectional view illustrating a chip type light emitting diode package 30 according to another embodiment of the present invention.

Referring to FIG. 4, in the chip type light emitting diode package 30, a chip mounting member is a printed circuit board 31 having leads 31a and 31b. A light emitting diode chip 33 is mounted on a mounting surface of the printed circuit board 31 and electrically connected to the leads 31a and 31b. The light emitting diode chip 33 may be mounted on the lead 31a as shown in this figure, but the present invention is not limited thereto. That is, the light emitting diode chip 33 may be mounted between the leads 31a and 31b and electrically connected to the leads. Meanwhile, a resin encapsulant 35 encapsulates the light emitting diode chip 33. The resin encapsulant 35 has a surface 35a treated using plasma. The printed circuit board 31 may also have a surface treated using plasma. A resin molding member 39 covers the surface treated resin encapsulant 35 and is bonded to the printed circuit board 31.

In this embodiment, the chip type light emitting diode package 30 may be fabricated by the same method as described with reference to FIGS. 2 and 3, except the chip mounting member. That is, the mounting and electrical connection of the light emitting diode chip 33, the formation of the resin encapsulant 35 and the resin molding member 30, the surface treatment, and the like may be performed through the same method as described with reference to FIGS. 2 and 3.

Figure 5:
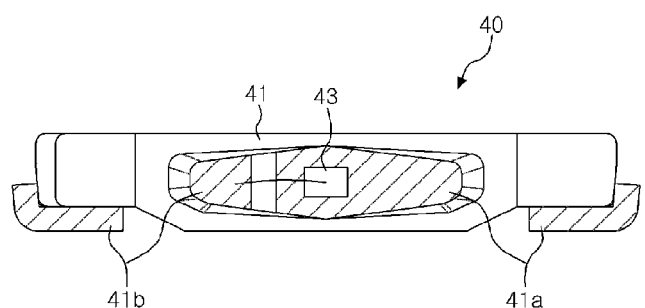
FIG. 5 is a front view illustrating a side view light emitting diode package according to an embodiment of the present invention.

FIG. 5 is a front view illustrating a side view light emitting diode package 40 according to a further embodiment of the present invention.

Referring to FIG. 5, in the side view light emitting diode package 40, a chip mounting member is a package main body 41 having leads 41a and 41b. The package main body 41 has a recess on a top surface thereof to expose the leads 41a and 41b. A light emitting diode chip 43 is mounted within the recess and electrically connected to the leads 41a and 41b. Meanwhile, a resin encapsulant (not shown) is formed in the recess to encapsulate the light emitting diode chip 43. The resin encapsulant has a surface (not shown) treated using plasma. Further, a resin molding member (not shown) covers the surface treated resin encapsulant and is bonded to the resin encapsulant.

In this embodiment, a method of fabricating the side view light emitting diode package 40 is the same as described with reference to FIGS. 2 and 3, except the structure of the package main body 41.

Figure 6:
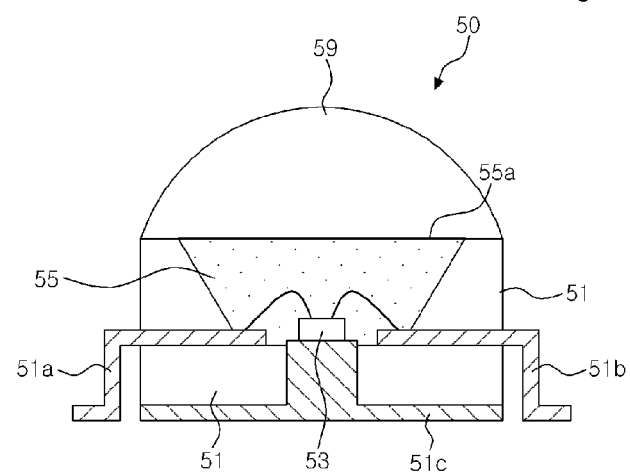
FIG. 6 is a sectional view illustrating a power type light emitting diode package according to an embodiment of the present invention.

FIG. 6 is a sectional view illustrating a power type light emitting diode package according to a still further embodiment of the present invention.

Referring to FIG. 6, in the power type light emitting diode package 50, a chip mounting member is a package main body 51 having leads 51a and 51b and a heat sink 51c. The package main body 51 has a recess on a top surface thereof to expose the leads 51a and 51b. The heat sink 51c is exposed in the recess. Further, the heat sink 51c may protrude to an upside of the recess. A light emitting diode chip 53 is mounted on the heat sink 51c and electrically connected to the leads 51a and 51b. Meanwhile, a resin encapsulant 55 encapsulates the light emitting diode chip 53, and a resin molding member 59 covers the resin encapsulant 55. The resin encapsulant 55 has a surface 55a treated using plasma, and thus, the resin molding member 59 is strongly bonded to the resin encapsulant 55.

In this embodiment, a method of fabricating the power type light emitting diode package 50 is the same as described with reference to FIGS. 2 and 3 except the structure of the package main body 51.

Figure 7:
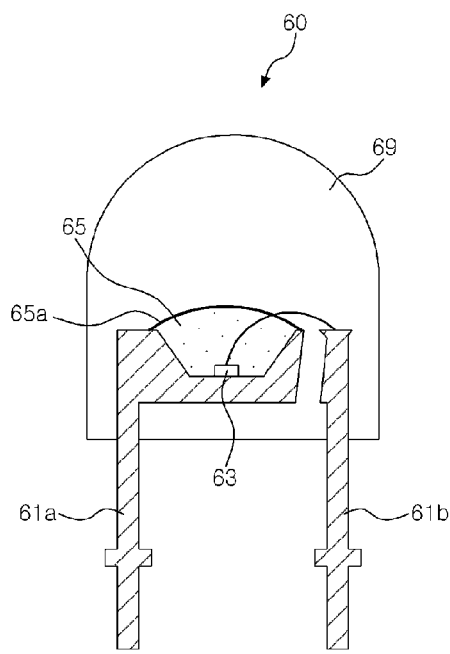
FIG. 7 is a sectional view illustrating a lamp type light emitting diode package according to an embodiment of the present invention.

FIG. 7 is a sectional view illustrating a lamp type light emitting diode package 60 according to a still further embodiment of the present invention.

Referring to FIG. 7, in the lamp type light emitting diode package 60, a chip mounting member is leads 61a and 61b. The lead 61a may have a recess on a top surface thereof. A light emitting diode chip 63 is mounted on the lead 61a and electrically connected to the leads 61a and 61b. The light emitting diode chip 63 and the lead 61b may be connected to each other through a bonding wire. Meanwhile, a resin encapsulant encapsulates the light emitting diode chip 63. A resin molding member 69 covers the resin encapsulant 65 and partially encapsulates the leads 61a and 61b. The resin encapsulant 65 has a surface 65a treated using plasma, and thus, the resin molding member 69 is strongly bonded to the resin encapsulant 65.

In this embodiment, a method of fabricating the lamp type light emitting diode package 60 is the same as described with reference to FIGS. 2 and 3, except the structure of the chip mounting member.

Meanwhile, it is shown that the phosphor is incorporated in the resin encapsulant in these embodiments, but the present invention is not limited thereto. That is, the phosphor may be incorporated in the resin molding member or provided on the light emitting diode chip. The phosphor converts the wavelength of the light emitted from the light emitting diode chip. The wavelength of the light emitted from the light emitting diode chip and a phosphor converting the wavelength of light emitted from the light emitting diode chip is appropriately selected, so that there can be provided a light emitting diode package for emitting light with a color required in a visual light region or white light.

For example, in a case where the light emitting diode chip emits blue light, the phosphor may be a phosphor absorbing blue light and emitting yellow light, or phosphors emitting green and red light. Further, in a case where the light emitting diode chip emits ultraviolet light, the phosphor may be phosphors absorbing the ultraviolet light and emitting blue and yellow light, or blue, green and red light. Accordingly, it is possible to provide a light emitting diode package capable of implementing white light.

In addition, a light emitting diode chip and/or a phosphor is appropriately selected, whereby it is possible to provide a light emitting diode package emitting light in regions except visual light, i.e., ultraviolet or infrared light.

The invention claimed is:

1. A light emitting diode package, comprising:
   a chip mounting member having a mounting surface for mounting a light emitting chip thereon and including at least two leads insulated from each other;
   at least one light emitting diode chip mounted on the mounting surface of the chip mounting member and electrically connected to the at least two leads;
   a resin encapsulant encapsulating the at least one light emitting diode chip on the chip mounting member, the resin encapsulant having a surface treated using plasma; and
   a resin molding member covering the resin encapsulant,
   wherein a surface of the chip mounting member is treated using plasma, and
   wherein the resin molding member is disposed directly on both the plasma treated surface of the resin encapsulant and the plasma treated surface of the chip mounting member.

2. The light emitting diode package as claimed in claim 1, wherein the resin molding member has hardness higher than that of the resin encapsulant.

3. The light emitting diode package as claimed in claim 2, wherein the resin encapsulant is a cured silicone resin, and the resin molding member is a cured epoxy resin.

4. The light emitting diode package as claimed in claim 1, wherein at least one of the resin encapsulant and the resin molding member incorporates one or more phosphors.

5. The light emitting diode package as claimed in claim 1, wherein the plasma treated surface of the chip mounting member is the top surface thereof.

6. The light emitting diode package as claimed in claim 5, wherein the plasma treated chip mounting member top surface is coterminous with the plasma treated resin encapsulant surface.

7. The light emitting diode package as claimed in claim 1, wherein the part where the plasma treated resin encapsulant surface directly contacts the resin molding member is not exposed to the outside of the light emitting diode package.

8. The light emitting diode package as claimed in claim 1, wherein the plasma treated surface of the resin encapsulant is in contact with the resin molding member.

9. The light emitting diode package as claimed in claim 1, wherein the plasma treated surface of the resin encapsulant is arranged opposite the mounting surface of the chip mounting member.

10. A light emitting diode package, comprising:
    a package body comprising a mounting surface;
    at least two leads insulated from each other, the at least two leads arranged on the package body;
    at least one light emitting diode chip arranged on the mounting surface, the at least one light emitting diode chip being electrically connected to the at least two leads;
    a resin encapsulant arranged on the at least one light emitting diode chip, the resin encapsulant comprising a plasma treated surface; and
    a resin molding member arranged on the resin encapsulant, wherein the plasma treated resin encapsulant surface is completely covered by the resin molding member.

11. A light emitting diode package, comprising:
    a chip mounting member having a mounting surface for mounting a light emitting chip thereon and including at least two leads insulated from each other;
    at least one light emitting diode chip mounted on the mounting surface of the chip mounting member and electrically connected to the at least two leads;
    a resin encapsulant encapsulating the at least one light emitting diode chip on the chip mounting member, the resin encapsulant having a surface treated using plasma; and
    a resin molding member covering the resin encapsulant,
    wherein the resin encapsulant directly contacts only the resin molding member and at least one of the at least two leads.

* * * * *